(12) United States Patent
Hars (10) Patent No.: US 10,680,618 B2
(45) Date of Patent: Jun. 9, 2020

(54) SYSTEMS AND METHODS FOR ON-CHIP TEMPERATURE STABILIZATION FOR TEMPERATURE-SENSITIVE COMPONENTS OF INTEGRATED CIRCUITS

(71) Applicant: THE BOEING COMPANY, Chicago, IL (US)

(72) Inventor: Laszlo Hars, Lafayette, CO (US)

(73) Assignee: THE BOEING COMPANY, Chicago, IL (US)

( * ) Notice: Subject to any disclaimer, the term of this patent is extended or adjusted under 35 U.S.C. 154(b) by 90 days.

(21) Appl. No.: 15/853,140

(22) Filed: Dec. 22, 2017

(65) Prior Publication Data

US 2019/0386664 A1    Dec. 19, 2019

(51) Int. Cl.
*H03L 1/04*    (2006.01)
*H03K 3/03*    (2006.01)

(52) U.S. Cl.
CPC ............. *H03L 1/04* (2013.01); *H03K 3/0315* (2013.01)

(58) Field of Classification Search
CPC ................................. H03L 1/04; H03K 3/0315
See application file for complete search history.

(56) References Cited

U.S. PATENT DOCUMENTS

| | | | |
|---|---|---|---|
| 8,981,810 | B1 | 3/2015 | Trimberger et al. |
| 9,602,110 | B1* | 3/2017 | Caffee ...................... H03L 1/00 |
| 2009/0134945 | A1* | 5/2009 | Kaneko .................. H03K 3/013 331/57 |
| 2010/0213919 | A1* | 8/2010 | Takayanagi ............. G06F 1/206 323/318 |
| 2011/0196628 | A1 | 8/2011 | Osada |
| 2012/0182054 | A1 | 7/2012 | Sabapathy et al. |

OTHER PUBLICATIONS

Extended European Search Report from corresponding European Patent Appl. No. 18214050.9, dated Jun. 21, 2019.

* cited by examiner

*Primary Examiner* — Jeffrey M Shin
(74) *Attorney, Agent, or Firm* — Womble Bond Dickinson LLP (57) ABSTRACT

An integrated circuit system is provided. The system includes a ring oscillator including a first plurality of logic gates connected in a ring configuration. The system also includes a second plurality of logic gates used to implement a heater to generate a controlled amount of heat. The second plurality of logic gates is also used to implement a temperature sensor to measure a temperature of the ring oscillator. The system further includes one or more logic circuits coupled to the heater and the temperature sensor. The one or more logic circuits are used to control the heater to heat the ring oscillator only until the temperature of the ring oscillator is one of a plurality of predefined temperatures, during or after which the ring oscillator starts and operate.

18 Claims, 3 Drawing Sheets

SYSTEMS AND METHODS FOR ON-CHIP TEMPERATURE STABILIZATION FOR TEMPERATURE-SENSITIVE COMPONENTS OF INTEGRATED CIRCUITS

TECHNOLOGICAL FIELD

The present disclosure relates generally to internal temperature stabilization for temperature-sensitive components of integrated circuits, in particular, to internal temperature stabilization for temperature-sensitive components of integrated circuits using a heater and a temperature sensor.

BACKGROUND

Some electronics in integrated circuits are sensitive to temperatures. Temperature-sensitive circuits behave unpredictably under changing temperatures. Ring oscillators are such temperature-sensitive circuits. Ring oscillators can be used as entropy sources to generate true random numbers used in information security, and as components of physical unclonable functions (PUFs), which provide practically unique ID numbers for chips. However, at startup, ring oscillators rapidly change their internal temperatures, which together with circuit noise and environmental effects lead to multiple unpredictable oscillation frequencies. This uncertainty of startup behavior of ring oscillators makes the available entropy unpredictable and the PUF values unreliable, and therefore may harm the information security. Thus, it is desired to stabilize temperature of ring oscillators at startup.

One existing solution to stabilize temperature of temperature-sensitive circuits such as ring oscillators includes placing the temperature-sensitive circuits in thermostat controlled enclosures, which is too large, expensive and slow to be useful. Another existing solution is to modify the temperature-sensitive circuits to improve their thermal properties, which is limited, instable and expensive. A third existing solution is to measure the circuit behavior at manufacturing and compensate for it in the field, which cannot handle the multiple unpredictable oscillation frequencies of ring oscillators.

Therefore it would be desirable to have a system and method that take into account at least some of the issues discussed above, as well as other possible issues.

BRIEF SUMMARY

Example implementations of the present disclosure are directed to temperature stabilization for temperature-sensitive circuits using a heater and a temperature sensor. In contrast to the existing solutions, example implementations provide temperature stabilization directly on the temperature-sensitive circuits such as ring oscillators. Thus, example implementations can remove large and variable temperature differences to any outside regulated temperatures. Also, example implementations provide a heater and a fast temperature sensor built with low cost and standard logic gates.

The present disclosure thus includes, without limitation, the following example implementations.

Some example implementations provide a method. The method is implemented by an integrated circuit system comprising a ring oscillator comprising a first plurality of logic gates connected in a ring configuration in which an output of each except a last of the plurality of logic gates is used as an input for a next one of the plurality of logic gates, the output of the last of the plurality of logic gates being fed back to and used as an input for a first of the plurality of logic gates. The method comprising generating a controlled amount of heat using a second plurality of logic gates to implement a heater; measuring a temperature of the ring oscillator using the second plurality of logic gates to implement a temperature sensor; and controlling the heater to heat the ring oscillator only until the temperature of the ring oscillator is one of a plurality of predefined temperatures, during or after which the ring oscillator starts and operates.

In some example implementations of the method of any preceding example implementation, or any combination of preceding example implementations, using the second plurality of logic gates to implement the heater includes using the second plurality of logic gates to implement a second ring oscillator that is the heater, and wherein controlling the heater includes switching an adjustable number of the second plurality of logic gates to cause the second ring oscillator to generate an adjustable amount of heat to thereby heat the ring oscillator.

In some example implementations of the method of any preceding example implementation, or any combination of preceding example implementations, the second plurality of logic gates includes a plurality of negative-AND (NAND) gates connected in series, and using the second plurality of logic gates to implement the heater includes using the plurality of NAND gates to implement the heater, wherein an input of a first of the plurality of NAND gates receives a clock signal, and wherein controlling the heater includes switching an adjustable number of the plurality of NAND gates to cause the plurality of NAND gates to generate an adjustable amount of heat to thereby heat the ring oscillator.

In some example implementations of the method of any preceding example implementation, or any combination of preceding example implementations, further comprising causing the ring oscillator to start and operate, and thereby generating heat as a supplement to heat from the heater before the ring oscillator is operable in an operation mode.

In some example implementations of the method of any preceding example implementation, or any combination of preceding example implementations, using the second plurality of logic gates to implement the temperature sensor includes using the second plurality of logic gates to implement another ring oscillator that is the temperature sensor, and wherein measuring the temperature of the ring oscillator includes measuring a temperature of the other ring oscillator based on an oscillation frequency of the other ring oscillator, and a known relationship between the oscillation frequency of the other ring oscillator and the temperature of the other ring oscillator, the temperature of the ring oscillator being construed as the temperature of the other ring oscillator.

In some example implementations of the method of any preceding example implementation, or any combination of preceding example implementations, the known relationship between the oscillation frequency of the other ring oscillator and the temperature of the other ring oscillator is defined in data indicating a respective oscillation frequency of the temperature sensor for each of the plurality of predefined temperatures.

In some example implementations of the method of any preceding example implementation, or any combination of preceding example implementations, using the second plurality of logic gates to implement the heater includes using the second plurality of logic gates to implement a second ring oscillator that is the heater, and using the second plurality of logic gates to implement the temperature sensor includes using the second plurality of logic gates to implement another ring oscillator that is the temperature sensor, wherein controlling the heater includes switching an adjustable number of the second plurality of logic gates to cause the second ring oscillator to generate an adjustable amount of heat to thereby heat the ring oscillator, and wherein measuring the temperature of the ring oscillator includes measuring a temperature of the other ring oscillator based on an oscillation frequency of the other ring oscillator, and a known relationship between the oscillation frequency of the other ring oscillator and the temperature of the other ring oscillator, the temperature of the ring oscillator being construed as the temperature of the other ring oscillator.

In some example implementations of the method of any preceding example implementation, or any combination of preceding example implementations, using the second plurality of logic gates to implement the temperature sensor includes using the second plurality of logic gates to implement a plurality of ring oscillators coupled to one another that is the temperature sensor, and wherein measuring the temperature of the ring oscillator includes measuring temperatures of the plurality of ring oscillators based on oscillation frequencies of the plurality of ring oscillators, and known relationships between the oscillation frequencies and the temperatures of the plurality of ring oscillators, the temperature of the ring oscillator being derived from the temperatures of the plurality of ring oscillators.

In some example implementations of the method of any preceding example implementation, or any combination of preceding example implementations, the ring oscillator is the temperature sensor, and wherein measuring the temperature of the ring oscillator includes measuring the temperature of the ring oscillator based on an oscillation frequency of the ring oscillator, and a known relationship between the oscillation frequency of the ring oscillator and the temperature of the ring oscillator.

In some example implementations of the method of any preceding example implementation, or any combination of preceding example implementations, the ring oscillator operates at one of a plurality of predetermined oscillation frequencies, and wherein the plurality of predefined temperatures includes a respective temperature for each of the plurality of predetermined oscillation frequencies.

Some example implementations provide an integrated circuit system comprising one or more logic circuits configured to at least perform the method of any preceding example implementation, or any combination of preceding example implementations.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference something as being a first, second or the like should not be construed to imply a particular order. Also, something may be described as being above something else (unless otherwise indicated) may instead be below, and vice versa; and similarly, something described as being to the left of something else may instead be to the right, and vice versa. Like reference numerals refer to like elements throughout.

Example implementations of the present disclosure are generally directed to internal temperature stabilization for temperature-sensitive components of integrated circuits, in particular, to internal temperature stabilization for temperature-sensitive components of integrated circuits using a heater and a temperature sensor.

Figure 1:
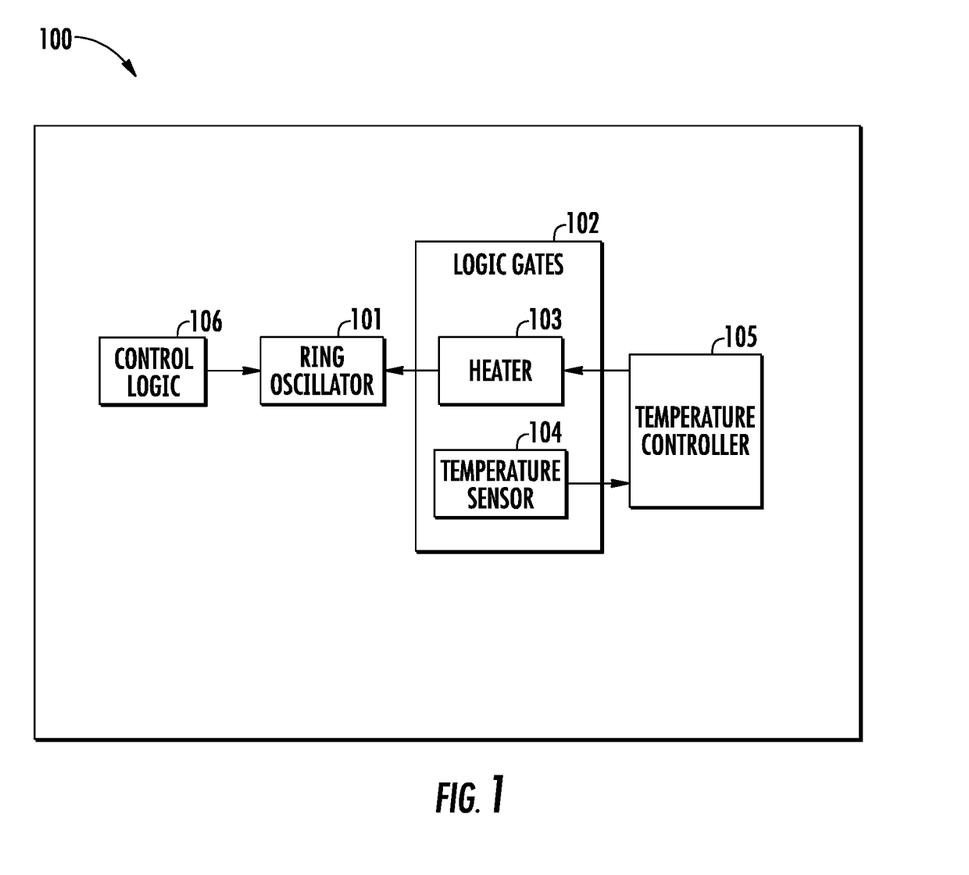
FIG. 1 illustrates an integrated circuit system according to example implementations of the present disclosure.

FIG. 1 illustrates an integrated circuit system 100 according to example implementations of the present disclosure. The integrated circuit system may include one or more of each of a number of components, units or the like (generally "components") at least some of which may include or be implemented with logic circuits such as multiplexers, registers, arithmetic logic units, memory, microprocessors and the like. The integrated circuit system may be designed for any of a number of different applications, and may have particular applicability to stabilize the temperature of a ring oscillator in the integrated circuit system.

In one example, the integrated circuit system 100 including a ring oscillator can provide security in a computer system with secure applications. For example, the ring oscillator can generate and provide true random numbers to a pseudorandom number generator as a seed. The pseudorandom number generator can use the seed to generate and provide pseudorandom numbers to the secure applications in the computer system. The secure applications may include a key generator to use the pseudorandom numbers to produce a block of ciphertext or message authentication code used in the computer system.

In some examples, as shown, the integrated circuit system includes a ring oscillator 101 (or another temperature-sensitive circuit). The ring oscillator includes a first plurality of logic gates connected in a ring configuration. In the ring configuration, an output of each except a last of the plurality of logic gates is used as an input for a next one of the plurality of logic gates. The output of the last of the plurality of logic gates is fed back to and used as an input for a first of the plurality of logic gates. The ring oscillator also includes an enable input configured to receive an enable signal to enable the ring oscillator. The ring oscillator of some examples will be described in FIG. 2A below.

In some examples, the integrated circuit system 100 includes a second plurality of logic gates 102. The second plurality of logic gates is configured to implement a heater 103 that is configured to generate a controlled amount of heat, and a temperature sensor 104 that is configured to measure a temperature of the ring oscillator 101.

In some examples, the integrated circuit system 100 includes a temperature controller 105 coupled to the heater 103 and the temperature sensor 104. The temperature controller is configured to control the heater to heat the ring oscillator 101 only until the temperature of the ring oscillator is one of a plurality of predefined temperatures, during or after which the ring oscillator is configured to start and operate. In one example, the plurality of predefined temperatures can be or include 0, 20, 40, 60, 80, 100, 120 and 140 C°.

Figure 2A:
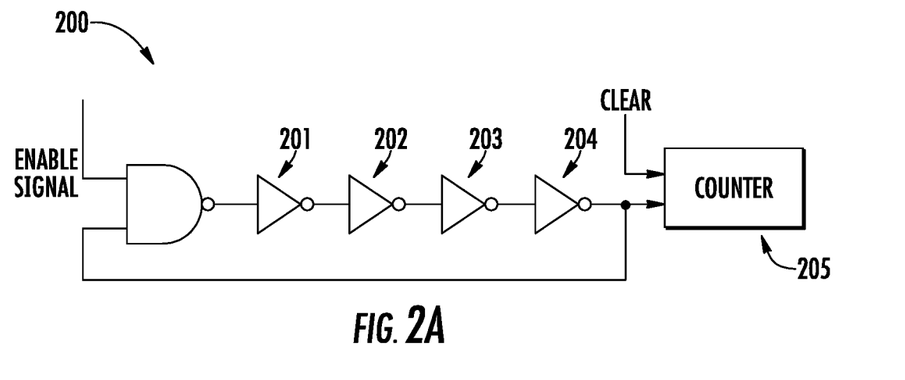
FIG. 2A illustrates a ring oscillator, according to various example implementations.

In some examples, the second plurality of logic gates 102 is configured to implement a second ring oscillator (as shown in FIG. 2A below) that is the heater 103. The temperature controller 105 is configured to switch an adjustable number of the second plurality of logic gates to cause the second ring oscillator to generate an adjustable amount of heat to thereby heat the ring oscillator 101.

Figure 2B:
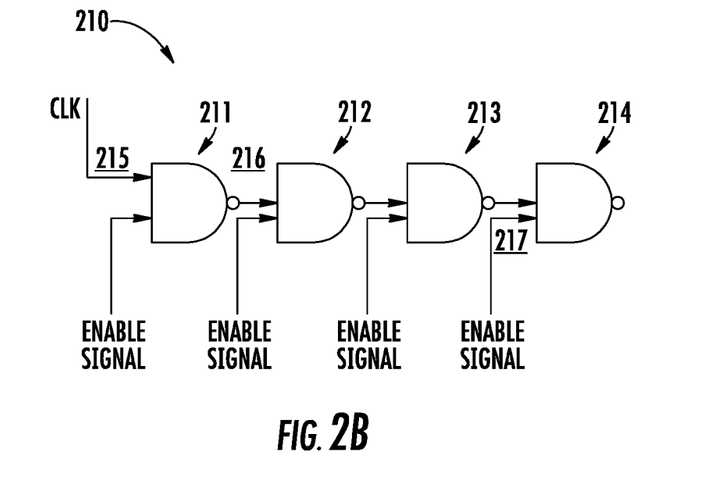
FIG. 2B illustrates a plurality of negative-AND (NAND) gates connected in series, according to various example implementations.

In some examples, the second plurality of logic gates 102 includes a plurality of NAND gates connected in series (as shown in FIG. 2B below). The plurality of NAND gates is configured to implement the heater 103. An input of a first of the plurality of NAND gates is configured to receive a clock signal. The temperature controller 105 is configured to switch an adjustable number of the plurality of NAND gates to cause the plurality of NAND gates to generate an adjustable amount of heat to thereby heat the ring oscillator 101.

In some examples, the integrated circuit system 100 includes a control logic 106. The control logic 106 is configured to cause the ring oscillator 101 to start and operate, and thereby generate heat as a supplement to heat from the heater 103 before the ring oscillator is operable in an operation mode.

In some examples, the second plurality of logic gates 102 is configured to implement another ring oscillator (as shown in FIG. 2A below) that is the temperature sensor 104. The temperature sensor is configured to measure a temperature of the other ring oscillator (the temperature sensor itself) based on an oscillation frequency of the other ring oscillator, and a known relationship. The known relationship is a relationship between the oscillation frequency of the other ring oscillator and the temperature of the other ring oscillator. The temperature of the ring oscillator 101 is construed as the temperature of the other ring oscillator. For example, the other ring oscillator can be next to or inside the ring oscillator 101, thus, the temperature of the other ring oscillator can be considered as the temperature of the ring oscillator 101.

In some examples, the known relationship between the oscillation frequency of the other ring oscillator and the temperature of the other ring oscillator is defined in data indicating a respective oscillation frequency of the temperature sensor for each of the plurality of predefined temperatures. The data can be stored in a memory of the temperature sensor 104 or the temperature controller 105. For example, the other ring oscillator can be calibrated. The calibrated data includes multiple (frequency, temperature) pairs, e.g., 20 . . . 50 such pairs. Each pair can indicate a predefined temperature of the other ring oscillator and the corresponding oscillation frequency of the other ring oscillator.

In some examples, the second plurality of logic gates 102 is configured to implement a second ring oscillator that is the heater 103, and another ring oscillator that is the temperature sensor 104. The temperature controller 105 is configured to switch an adjustable number of the second plurality of logic gates to cause the second ring oscillator to generate an adjustable amount of heat to thereby heat the ring oscillator 101. The temperature sensor is configured to measure a temperature of the other ring oscillator (the temperature sensor itself) based on an oscillation frequency of the other ring oscillator, and a known relationship. The known relationship is a relationship between the oscillation frequency of the other ring oscillator and the temperature of the other ring oscillator. In these examples, the temperature of the ring oscillator 101 is construed as the temperature of the other ring oscillator.

In some examples, the second plurality of logic gates 102 is configured to implement a plurality of ring oscillators coupled to one another and configured to implement the temperature sensor 104. The temperature sensor is configured to measure temperatures of the plurality of ring oscillators. The measurement is based on oscillation frequencies of the plurality of ring oscillators, and known relationships between the oscillation frequencies and the temperatures of the plurality of ring oscillators. The temperature of the ring oscillator 101 is derived from the temperatures of the plurality of ring oscillators.

In some examples, the ring oscillator 101 is the temperature sensor 104. The temperature sensor (the ring oscillator itself) is configured to measure the temperature of the ring oscillator based on an oscillation frequency of the ring oscillator, and a known relationship. The know relationship is a relationship between the oscillation frequency of the ring oscillator and the temperature of the ring oscillator.

In some examples, the ring oscillator 101 is configured to operate at one of a plurality of predetermined oscillation frequencies. The plurality of predefined temperatures includes a respective temperature for each of the plurality of predetermined oscillation frequencies. For example, the ring oscillator can be calibrated. The calibrated data includes multiple (frequency, temperature) pairs, e.g., 20 . . . 50 such pairs. Each pair can indicate a predefined oscillation frequency and the corresponding temperature when the ring oscillator is operating with the predefined oscillation frequency.

FIG. 2A illustrates a ring oscillator 200 according to various example implementations. In some examples, as shown, the ring oscillator includes a plurality of logic gates connected in a ring configuration, e.g., the logic gates 201-204. In the ring configuration, an output of each except a last of the plurality of logic gates is used as an input for a next one of the plurality of logic gates. For example, as shown, the output of the logic gate 201 is used as an input for the logic gate 202, and the output of the logic gate 202 is used as an input for the logic gate 203. Also, in the ring configuration, the output of the last of the plurality of logic gates is fed back to and used as an input for a first of the plurality of logic gates. For example, the output of the last logic gate 204 in the series is fed back to and used as an input for the first logic gate 201 in the series.

In one example, the ring oscillator 200 can receive an enable signal to start and stop the oscillation of the ring oscillator. The enable signal can start or stop the ring oscillator, by any means known in the art, including the use of a NAND or NOR gate or a latch among the logic gates of the ring oscillator, with an input that starts or stops the oscillation. The enable signal can be provided to any of the logic gates 201-204. In another example, the enable signal can be used to control the temperature controller 105 which may include a microprocessor with firmware or a state machine.

In one example, the ring oscillator 200 is equipped with a counter 205 that is configured to count impulses of oscillating outputs of the ring oscillator. For example, as shown in FIG. 2, the output of the last of the plurality of inverters, e.g., the inverter 204, is sent to the counter. The counter generates counter values by counting oscillation periods in one or more predefined counting periods. The counter values indicate the oscillation frequency of the ring oscillator 200.

In one example, the ring oscillator 200 can be the ring oscillator 101 in the integrated circuit system 100. In another example, the ring oscillator 200 can be the second ring oscillator that is the heater 103. In another example, the ring oscillator 200 can be the other ring oscillator that is the temperature sensor 104. In a further example, the ring oscillator 200 can be any one of the plurality of ring oscillators coupled to one another and configured to implement the temperature sensor 104. When the ring oscillator 200 are used as the heater 103 or the temperature sensor 104, the heater 103 or the temperature sensor 104 may have different number of logic gates or different configurations than the ring oscillator 101.

FIG. 2B illustrates a plurality of NAND gates 210 connected in series, according to various example implementations. As shown, in one example, the plurality of NAND gates includes multiple NAND gates, e.g., the NAND gates 212-214. The output of a previous NAND gate is connected to the first input of a next NAND gate in the series. For example, the output of the NAND gate 211 is connected to the first input 216 of the NAND gate 212. In some examples, the first input 215 of the first NAND gate 211 is fed by a clock signal with a constant frequency (e.g., by the system clock of frequency=100 MHz). The tail of the series of NAND gates can be disabled by an enable signal with logic level 0 at the second input of a selected NAND gate, e.g., at the second input 217 of the NAND gate 214. The tail of the series can be also disabled at the second input of a different NAND gate, e.g., at the second input of the NAND gate 213 by an enable signal with logic level 0. In some examples, the plurality of NAND gates is configured to implement the heater 103.

In one example, at 32 nm or smaller feature sizes of integrated circuits certain gates slow down, and other gate speed up with temperature. At different initial temperatures the trends may reverse. If the gates are built of short channel MOSFET transistors, their temperature related behavior is quite unpredictable and depends on manufacturing variations. On the other hand, gates built with long channel transistors generally slow down with increasing temperatures. Such gates may or may not be included in standard component libraries of the chosen manufacturing technologies.

In one example, when a ring oscillator starts to oscillate, it warms up. This is because energy is turned to heat in internal resistors during the load capacitance is charged or discharged (the energy turned to heat is the same as the stored energy in the load capacitor). Higher temperatures may cause faster oscillation leading to further warm up (with more switching events in unit time and more capacitive loads are charged or discharged), until an equilibrium is reached. At high oscillation frequencies the signal amplitude starts to diminish, and the power consumption also decreases. Thus, the equilibrium is reached before a possible meltdown of the silicon in the ring oscillator.

In one example, the nonlinear nature of these two trends described above and their complex interactions can lead to unpredictable oscillation frequencies. For certain ring oscillators, there can be more than 5 stable but unpredictable oscillation frequencies under the same environmental conditions. These random stable oscillation frequencies (which may be diversified by the circuit noise) may harm information security using ring oscillators. For example, the random stable oscillation frequencies can make the ring oscillator based physical unclonable function (PUF) circuits to malfunction, or make the ring oscillator based entropy generators to enter into untested state of operation with unknown amount of generated entropy.

In one example, a predictable operational state of a ring oscillator cannot be achieved by just running the ring oscillator (or other temperature-sensitive circuits) for a while, until the local temperature around the ring oscillator reaches a stable value. In this way, stable temperatures are indeed reached. However, these temperature values can be one of several different, unpredictable values. As described above, there can be more than 5 stable points for the ring oscillator (equilibria), with different oscillation frequencies and different local temperatures under the same environmental conditions.

In one example, setting the stabilized temperature of the ring oscillator 101 to one fixed value would require that this temperature is above the maximum operational temperature of the die of the integrated circuit system 100, e.g., an application-specific integrated circuit (ASIC). The integrated circuit system can operate well in hot environments. However, this approach consumes a lot of energy in cold ambient temperatures. Furthermore, starting from a cold die to reach the stable temperature takes a long time. In one example, this single hot temperature setting may be adequate for the ring oscillator if the ring oscillator is used to generate stable signals with accurate frequencies (clock signals) or voltage references.

In one example, for information security applications the desired stable temperature of the ring oscillator 101 can be one of several preset values. The several preset values can be distributed in the full operational temperature range of the integrated circuit system 100. The desired stable temperature can be higher than the die temperature in the current operational conditions. In one example, the stabilized temperature may be set to at least 20 C° above the average die temperature, or the temperature measured far away from the protected circuit, e.g., the ring oscillator, under normal operations. In one example, if the integrated circuit system operates between −20 . . . 120 C°, the target temperature of the ring oscillator can be or include 0, 20, 40, 60, 80, 100, 120 and 140 C°. The difference between temperatures of the inactive protected circuit and the target temperature can be dependent on the heat generated by the protected circuit, e.g., the ring oscillator.

In one example, a multi-temperature operation requires calibration in most applications. For example, a ring oscillator based PUF device may need different input at each of the preset stable temperature values. The different input need to be determined at a calibration process before deploying the PUF device. During regular operation the appropriate input for the PUF is easy to provide. The firmware of the PUF device acquires the current stable temperature value, and acts accordingly. In one example, such temperature calibrations (e.g., for ring oscillator based PUF devices) are needed, even when no temperature stabilization is implemented. In this example, many temperature points have to be considered, with potentially many corresponding calibration data sets (e.g., more stored input sequences for a ring oscillator based PUF device).

In one example, a heater 103 can generate a controlled amount of heat by switching a resistive load on and off as needed. However, this approach needs analog components: a current switch, and a (distributed) resistor of large size, which are expensive, specially designed components, and are not available in the standard component libraries for generally used ASIC technologies.

In one example, the heater 103 can generate a controlled amount of heat by periodically switching many logic gates on and off. The charging and discharging current of load capacitors of the logic gates can produce heat in the resistance of the output transistors. The heating logic gates can be arranged as a ring oscillator 200 or as a plurality of NAND gates 210 connected in series, with natural delays in their switching points. These heating logic gates are not concentrated to one point on the die. Instead, with appropriate layout techniques, the heating logic gates can be interleaved with or around the components of the integrated circuit system 100 that need temperature regulation. In one example, the heater can be next to the ring oscillator 101 to heat the ring oscillator.

In some examples, the second plurality of logic gates 102 is configured to implement a second ring oscillator (with a variable length) that is the heater 103. The temperature controller 105 is configured to switch an adjustable number of the second plurality of logic gates to cause the second ring oscillator to generate an adjustable amount of heat to thereby heat the ring oscillator 101. For example, the second ring oscillator, e.g., the ring oscillator 200, can have a variable length of the ring (a multiplexer activates one of many feedback points, thereby it selects a variable number of active logic gates such as the logic gates 201-204). In one example, the second ring oscillator can be a sufficiently long ring oscillator with a sufficient number of logic gates. A sufficiently long ring oscillator consumes about the same power, regardless of the length of the ring. In the sufficiently long ring oscillator, there is one switching event after every time period of a gate delay, and these switching events fully charge/discharge a load capacitor. The heat can be generated in the output transistors of the gates by their channel resistance.

On the other hand, if the second ring oscillator (with a variable length) gets shorter, the power consumption diminishes. That is, before the load capacitor is fully charged or discharged, the charging current gets reversed. The signal amplitude is smaller than the full supply voltage span. Thus, by switching an adjustable number of logic gates of the second ring oscillator, an adjustable amount of heat can be generated. In one example, in order to switch an adjustable number of logic gates of the second ring oscillator, the feedback point of the second ring oscillator (a long ring oscillator) can be chosen by a multiplexer to make the ring shorter (and also stop the excluded gates). Shortening the ring reduces the power consumption, which leads to less heat.

In some examples, the second plurality of logic gates 102 includes a plurality NAND gates 210 connected in series (an open chain). The plurality of NAND gates is configured to implement the heater 103. The temperature controller 105 is configured to switch an adjustable number of the plurality of NAND gates (e.g., the NAND gates 211-214) to cause the plurality of NAND gates to generate an adjustable amount of heat to thereby heat the ring oscillator 101. In one example, the NAND gates switch so fast that next gate already starts consuming power, while current gate is still charging its load capacitor (which is the input capacitance of the next gate). The result is a steady current draw, until the tail-stop point is reached. If the chain is long enough, multiple gates switch simultaneously (t=1/f total delays apart). Thus, the plurality of NAND gates can provide the advantages that the control range of the heater is large, the temperature control is linear, and any side channel leakage is irrelevant.

Similarly as describe above, by switching an adjustable number of the plurality of NAND gates, an adjustable amount of heat can be generated. In one example, in order to switch an adjustable number of the plurality of NAND gates, the tail of the series of NAND gates can be disabled by a logic signal with logic level 0 at the second input of a selected NAND gate, e.g., at the second input 217 of the NAND gate 214.

In one example, the protected circuit, e.g., the ring oscillator 101, may also be switched on (by the control logic 106) during the warm-up period to contribute to the heating, even though the protected circuit is not in a stable operational condition. In this example, the control logic 106 is configured to cause the ring oscillator to start and operate, and thereby generate heat as a supplement to heat from the heater 103 before the ring oscillator is operable in an operation mode.

In one example, the temperature sensor can be an analog temperature sensor that is not part of gate libraries provided for various integrated circuit technologies. The analog temperature sensor can be large, slow and expensive. On the other hand, the analog temperature sensor does not generate much heat, is independent of the heater 103, and has no exploitable side channel leakage.

In one example, the temperature sensor 104 can be a ring oscillator (e.g., the ring oscillator 200) of gates with output transistors of long channels (e.g., taken from the standard library of logic gates). The ring oscillator with long channel transistors can measure temperature because the oscillation frequency of such a ring oscillator monotonically decreases with temperature. A period counter can measure the oscillation frequency of the temperature sensor (a ring oscillator with long channel transistors) by counting oscillation periods for a preset time duration. Based on the measured oscillation frequency, the temperature of the temperature sensor can be determined based on the monotonic relationship between the oscillation frequency and the temperature. The measurement can be restarted when needed. In one example, the temperature sensor can be next to or inside the ring oscillator 101. Thus, the temperature of the temperature sensor can be considered as the temperature of the ring oscillator. That is, the temperature of the ring oscillator 101 can be construed as the temperature of the temperature sensor (a ring oscillator with long channel transistors).

In one example, the ring oscillator with long channel transistors needs calibration, unless only a lower/higher comparison result relative to a target temperature is needed. The calibration data can include the expected counter values (the expected frequencies) of the ring oscillator for each target temperature. The ring oscillator based temperature sensor can generate heat and heat up the die of the integrated circuit system 100 locally. Therefore, a high frequency ring oscillator can be used as the temperature sensor, which consumes less power.

In another example, the temperature sensor 104 can be a ring oscillator (e.g., the ring oscillator 200) with short channel transistors. For such a ring oscillator, the oscillation frequency vs. temperature function F=f(T) is first increasing (from low temperatures) till a certain turnaround temperature, and then the frequency decreases with further increasing temperatures. Here F is the measured oscillation frequency and T is the corresponding temperature of the temperature sensor. The turnaround temperature $T_0$ may be outside of the operational temperature range, in which case the frequency is a monotonic function of the temperature. When using the ring oscillator with short channel transistors as the temperature sensor 104, there are 2 possibilities: 1) some frequency values correspond to a single temperature, and 2) other frequency values may come up at two distinct temperatures.

In one example, when there are two temperatures leading to the same oscillation frequency, the differential of the oscillation frequency vs. temperature function f'(T) has different signs: at the lower temperature $T_1$ the frequency increases with the temperature (f'($T_1$)>0), at the higher temperature $T_2$ the frequency decreases with the temperature (f'($T_2$)<0). Calibration data can be collected at several (n) equidistant temperature points, e.g., in a temperature oven with the expected (average) frequency determined from counter values. Since the function f(T) is always smooth, practical values for n can be 20 . . . 50. With interpolation the function f(T) and its differential f'(T) can be reconstructed at reasonable accuracy.

In on example, the true temperature is determined from the measured frequency F, by interpolating in the inverse function $f^{-1}$. When the measured frequency F corresponds to two temperatures, $T_1$<$T_2$ (determined by interpolation in the two branches of $F^1$), an extra step is performed: slightly increase the heat generated by the heating element. If the oscillator frequency also increases, the actual temperature T=$T_1$, otherwise T=$T_2$. In one example, the temperature sensor 104 can be next to or inside the ring oscillator 101. The temperature of the ring oscillator 101 can be construed as the temperature of the temperature sensor (a ring oscillator with short channel transistors).

In one example, when the frequency is off target, the heating power can be reduced or increased by the amount computed from the stored differential and by the difference of the expected and actual counter values. Using a ring oscillator (e.g., the ring oscillator 200) with short channel transistors as the temperature sensor 104 can provide an advantage that the hardware is simple with only low-cost standard logic gates. In one example, if the temperature is measured frequently, small changes are expected. The small changes allow obtaining the true temperature values without applying extra heat, at least when the temperature is not close to the turnaround temperature $T_0$.

In one example, the temperature sensor 104 includes a plurality of ring oscillators, e.g., multiple ring oscillators 200, laid out next to each other (and next to the protected ring oscillator 101. For example, the temperature sensor can include two ring oscillators. The two ring oscillators have different oscillation frequency vs. temperature functions: F=$f_1$(T) and F=$f_2$(T). When there is an ambiguity of the temperature measurements with one ring oscillator: $f_1$($T_1$)=$f_1$($T_2$), the second and different ring oscillator with different frequency vs. temperature function will not have the same ambiguity: $f_2$($T_1$)≠$f_2$($T_2$). The temperature controller 105 can determine the correct temperature value using the calibration data of both ring oscillators. In one example, even if $f_2$ is ambiguous, the ambiguous temperature estimates only agree at the true temperature.

In one example, the ring oscillator 101 can be its own temperature sensor 104. Thus, the ring oscillator can measure its own temperature using the oscillation frequency vs. temperature function F=f(T) as described above. If the ring oscillator is also its own temperature sensor, it needs to be switched on before it is actually used for its intended purposes. This could increase the information leaked in side channels. However, this side channel leakage is not a serious security issue, since at startup the temperature of the ring oscillator rapidly changes, and so the leaked information does not concern the real operational conditions.

In one example, the integrated circuit system 100 includes multiple ring oscillators 101 that are temperature sensitive. The multiple ring oscillators can be their own temperature sensors, thus, there is no need to apply extra heat. In this example, the ring oscillators can be switched off and immediately switched back on, to thwart phase tracking attacks on ring oscillator entropy sources, and lock-and-follow attacks on ring oscillator based PUF devices. In another example, the heater 103 and the temperature sensor 104 can be the same ring oscillator.

In one example, when the ring oscillator 101 starts up, the local die temperature rises. The temperature sensor 104 detects this heat, and as a response, the temperature controller 105 reduces the generated heat. This causes a temperature swing with instability at startup of the ring oscillator. The temperature swing can be mitigated by reducing the heating power by as much as the power of the ring oscillator. The amount of heat reduction can be determined at calibration time, such that the startup temperature swing is minimized. In another example, the ring oscillator is not used immediately at the (unstable) startup, but used only after a time period. However, this may increase the information leakage on side channels.

Figure 3:
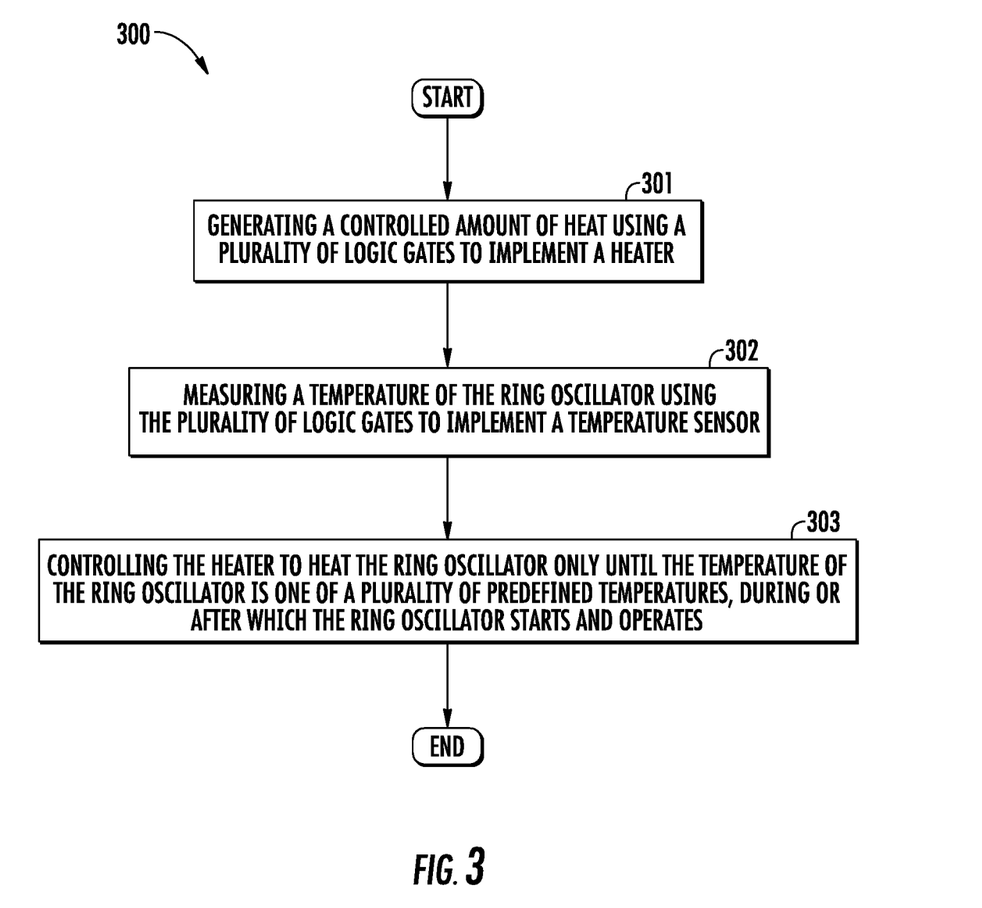
FIG. 3 is a flowchart illustrating various steps in a method of stabilizing the temperature of a ring oscillator in the integrated circuit system according to various example implementations.

FIG. 3 is a flowchart illustrating various steps in a method 300 of stabilizing the temperature of a ring oscillator in the integrated circuit system according to various example implementations. The method is implemented by the integrated circuit system 100. The integrated circuit system includes a ring oscillator 101 comprising a first plurality of logic gates connected in a ring configuration. In the ring configuration, an output of each except a last of the plurality of logic gates is used as an input for a next one of the plurality of logic gates. The output of the last of the plurality of logic gates is fed back to and used as an input for a first of the plurality of logic gates. At block 301, the method includes generating a controlled amount of heat using a second plurality of logic gates 102 to implement a heater 103. At block 302, the method includes measuring a temperature of the ring oscillator using the second plurality of logic gates 102 to implement a temperature sensor 104. At block 303, the method includes controlling the heater to heat the ring oscillator only until the temperature of the ring oscillator is one of a plurality of predefined temperatures, during or after which the ring oscillator starts and operates.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An integrated circuit system comprising:
   a ring oscillator comprising a first plurality of logic gates connected in a ring configuration in which an output of each except a last of the plurality of logic gates is used as an input for a next one of the plurality of logic gates, the output of the last of the plurality of logic gates being fed back to and used as an input for a first of the plurality of logic gates;
   a second plurality of logic gates configured to implement a heater configured to generate a controlled amount of heat, the second plurality of logic gates also being configured to implement a temperature sensor configured to measure a temperature of the ring oscillator; and
   one or more logic circuits coupled to the heater and the temperature sensor, and configured to control the heater to heat the ring oscillator only until the temperature of the ring oscillator is one of a plurality of predefined temperatures, during or after which the ring oscillator is configured to start and operate,
   wherein the second plurality of logic gates is configured to implement a second ring oscillator that is the heater, and
   wherein the one or more logic circuits being configured to control the heater includes being configured to switch an adjustable number of the second plurality of logic gates to cause the second ring oscillator to generate an adjustable amount of heat to thereby heat the ring oscillator.

2. The integrated circuit system of claim 1, wherein the second plurality of logic gates includes a plurality of negative-AND (NAND) gates connected in series and configured to implement the heater, an input of a first of the plurality of NAND gates being configured to receive a clock signal, and
   wherein the one or more logic circuits being configured to control the heater includes being configured to switch an adjustable number of the plurality of NAND gates to cause the plurality of NAND gates to generate an adjustable amount of heat to thereby heat the ring oscillator.

3. The integrated circuit system of claim 1, wherein the one or more logic circuits are further configured to cause the ring oscillator to start and operate, and thereby generate heat as a supplement to heat from the heater before the ring oscillator is operable in an operation mode.

4. The integrated circuit system of claim 1, wherein the second plurality of logic gates is configured to implement another ring oscillator that is the temperature sensor, and
   wherein the temperature sensor being configured to measure the temperature of the ring oscillator includes being configured to measure a temperature of the another ring oscillator based on an oscillation frequency of the another ring oscillator, and a known relationship between the oscillation frequency of the another ring oscillator and the temperature of the another ring oscillator, the temperature of the ring oscillator being construed as the temperature of the another ring oscillator.

5. The integrated circuit system of claim 4, wherein the known relationship between the oscillation frequency of the another ring oscillator and the temperature of the another ring oscillator is defined in data indicating a respective oscillation frequency of the temperature sensor for each of the plurality of predefined temperatures.

6. The integrated circuit system of claim 1, wherein the second plurality of logic gates is configured to implement a second ring oscillator that is the heater, and another ring oscillator that is the temperature sensor,
   wherein the one or more logic circuits being configured to control the heater includes being configured to switch an adjustable number of the second plurality of logic gates to cause the second ring oscillator to generate an adjustable amount of heat to thereby heat the ring oscillator, and
   wherein the temperature sensor being configured to measure the temperature of the ring oscillator includes being configured to measure a temperature of the other ring oscillator based on an oscillation frequency of the other ring oscillator, and a known relationship between the oscillation frequency of the other ring oscillator and the temperature of the other ring oscillator, the temperature of the ring oscillator being construed as the temperature of the other ring oscillator.

7. The integrated circuit system of claim 1, wherein the second plurality of logic gates is configured to implement a plurality of ring oscillators coupled to one another and configured to implement the temperature sensor, and
   wherein the temperature sensor being configured to measure the temperature of the ring oscillator includes being configured to measure temperatures of the plurality of ring oscillators based on oscillation frequencies of the plurality of ring oscillators, and known relationships between the oscillation frequencies and the temperatures of the plurality of ring oscillators, the temperature of the ring oscillator being derived from the temperatures of the plurality of ring oscillators.

8. The integrated circuit system of claim 1, wherein the temperature sensor being configured to measure the temperature of the ring oscillator includes being configured to measure the temperature of the ring oscillator based on an oscillation frequency of the ring oscillator, and a known relationship between the oscillation frequency of the ring oscillator and the temperature of the ring oscillator.

9. The integrated circuit system of claim 1, wherein the ring oscillator is configured to operate at one of a plurality of predetermined oscillation frequencies, and wherein the plurality of predefined temperatures includes a respective temperature for each of the plurality of predetermined oscillation frequencies.

10. A method implemented by an integrated circuit system the integrated circuit system comprising a ring oscillator comprising a first plurality of logic gates connected in a ring configuration in which an output of each except a last of the plurality of logic gates is used as an input for a next one of the plurality of logic gates, the output of the last of the plurality of logic gates being fed back to and used as an input for a first of the plurality of logic gates, the method comprising:

generating a controlled amount of heat using a second plurality of logic gates to implement a heater;

measuring a temperature of the ring oscillator using the second plurality of logic gates to implement a temperature sensor; and     controlling the heater to heat the ring oscillator only until the temperature of the ring oscillator is one of a plurality of predefined temperatures, during or after which the ring oscillator starts and operates,     wherein using the second plurality of logic gates to implement the heater includes using the second plurality of logic gates to implement a second ring oscillator that is the heater, and     wherein controlling the heater includes switching an adjustable number of the second plurality of logic gates to cause the second ring oscillator to generate an adjustable amount of heat to thereby heat the ring oscillator.

11. The method of claim 10, wherein the second plurality of logic gates includes a plurality of negative-AND (NAND) gates connected in series, and using the second plurality of logic gates to implement the heater includes using the plurality of NAND gates to implement the heater, wherein an input of a first of the plurality of NAND gates receives a clock signal, and     wherein controlling the heater includes switching an adjustable number of the plurality of NAND gates to cause the plurality of NAND gates to generate an adjustable amount of heat to thereby heat the ring oscillator.

12. The method of claim 10, further comprising causing the ring oscillator to start and operate, and thereby generating heat as a supplement to heat from the heater before the ring oscillator is operable in an operation mode.

13. The method of claim 10, wherein using the second plurality of logic gates to implement the temperature sensor includes using the second plurality of logic gates to implement another ring oscillator that is the temperature sensor, and     wherein measuring the temperature of the ring oscillator includes measuring a temperature of the another ring oscillator based on an oscillation frequency of the another ring oscillator, and a known relationship between the oscillation frequency of the another ring oscillator and the temperature of the another ring oscillator, the temperature of the ring oscillator being construed as the temperature of the another ring oscillator.

14. The method of claim 13, wherein the known relationship between the oscillation frequency of the another ring oscillator and the temperature of the another ring oscillator is defined in data indicating a respective oscillation frequency of the temperature sensor for each of the plurality of predefined temperatures.

15. The method of claim 10, wherein using the second plurality of logic gates to implement the heater includes using the second plurality of logic gates to implement a second ring oscillator that is the heater, and using the second plurality of logic gates to implement the temperature sensor includes using the second plurality of logic gates to implement another ring oscillator that is the temperature sensor,     wherein controlling the heater includes switching an adjustable number of the second plurality of logic gates to cause the second ring oscillator to generate an adjustable amount of heat to thereby heat the ring oscillator, and     wherein measuring the temperature of the ring oscillator includes measuring a temperature of the other ring oscillator based on an oscillation frequency of the other ring oscillator, and a known relationship between the oscillation frequency of the other ring oscillator and the temperature of the other ring oscillator, the temperature of the ring oscillator being construed as the temperature of the other ring oscillator.

16. The method of claim 10, wherein using the second plurality of logic gates to implement the temperature sensor includes using the second plurality of logic gates to implement a plurality of ring oscillators coupled to one another that is the temperature sensor, and     wherein measuring the temperature of the ring oscillator includes measuring temperatures of the plurality of ring oscillators based on oscillation frequencies of the plurality of ring oscillators, and known relationships between the oscillation frequencies and the temperatures of the plurality of ring oscillators, the temperature of the ring oscillator being derived from the temperatures of the plurality of ring oscillators.

17. The method of claim 10, wherein measuring the temperature of the ring oscillator includes measuring the temperature of the ring oscillator based on an oscillation frequency of the ring oscillator, and a known relationship between the oscillation frequency of the ring oscillator and the temperature of the ring oscillator.

18. The method of claim 10, wherein the ring oscillator operates at one of a plurality of predetermined oscillation frequencies, and wherein the plurality of predefined temperatures includes a respective temperature for each of the plurality of predetermined oscillation frequencies.

\* \* \* \* \*